United States Patent [19]

Hoffmann et al.

[11] 4,266,151

[45] May 5, 1981

[54] SEMICONDUCTOR CIRCUIT WITH AT LEAST TWO FIELD EFFECT TRANSISTORS UNITED IN A SEMICONDUCTOR CRYSTAL

[75] Inventors: Kurt Hoffmann, Taufkirchen; Roland Ernst, Munich, both of Fed. Rep. of Germany

[73] Assignee: Siemens Aktiengesellschaft, Berlin and Munich, Fed. Rep. of Germany

[21] Appl. No.: 20,857

[22] Filed: Mar. 15, 1979

[30] Foreign Application Priority Data

Mar. 21, 1978 [DE]  Fed. Rep. of Germany ....... 2812378

[51] Int. Cl.$^3$ .............................................. H03K 3/01
[52] U.S. Cl. .................................... 307/297; 307/279
[58] Field of Search ................................ 307/297, 279

[56] References Cited

U.S. PATENT DOCUMENTS

| | | |
|---|---|---|
| 4,004,164 | 1/1977 | Cranford et al. .................... 307/297 |
| 4,115,710 | 9/1978 | Lou ..................................... 307/297 |

OTHER PUBLICATIONS

"Fast Mostek Rom-", Electronics, Sep. 16, 1976, p. 42.
"Substrate and Load Gate Voltage Compensation", by Blaser et al., IEEE International Solid State Circuit Conference, 1976, pp. 56, 57.

*Primary Examiner*—Harold A. Dixon
*Attorney, Agent, or Firm*—Hill, Van Santen, Steadman, Chiara & Simpson

[57] ABSTRACT

A monolithically integrated MOS-circuit with a substrate bias voltage generator is disclosed. A generator, a control loop, a threshold voltage detector, and a pump circuit are provided. An acceleration of the regulation of the substrate bias voltage is achieved wherein the output signal of an oscillator is connected to the Reset or Set input of a RS flip-flop. The two outputs of the flip-flop are applied in common to the substrate of the MOS-circuit via a respective pump circuit. A control loop with the threshold voltage detector serving for the regulation of the substrate bias voltage controls the flip onset via an additional input of the flip-flop and, thus, the substrate bias voltage.

16 Claims, 4 Drawing Figures

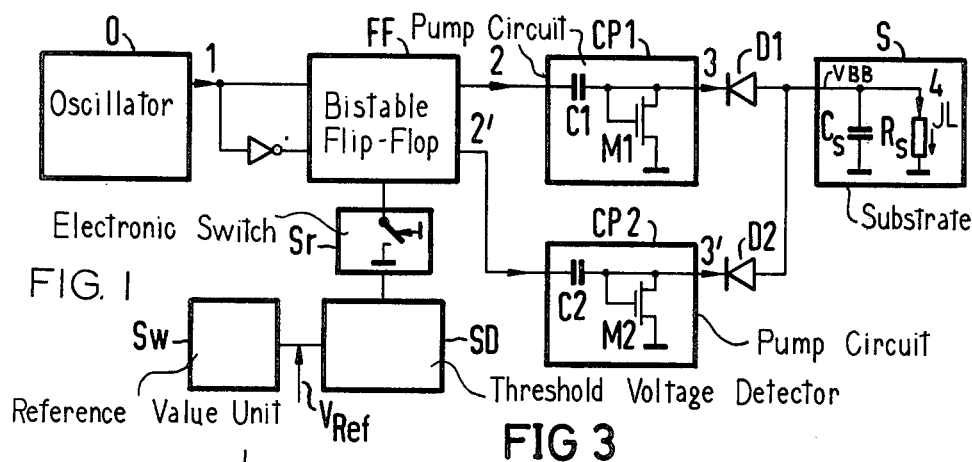
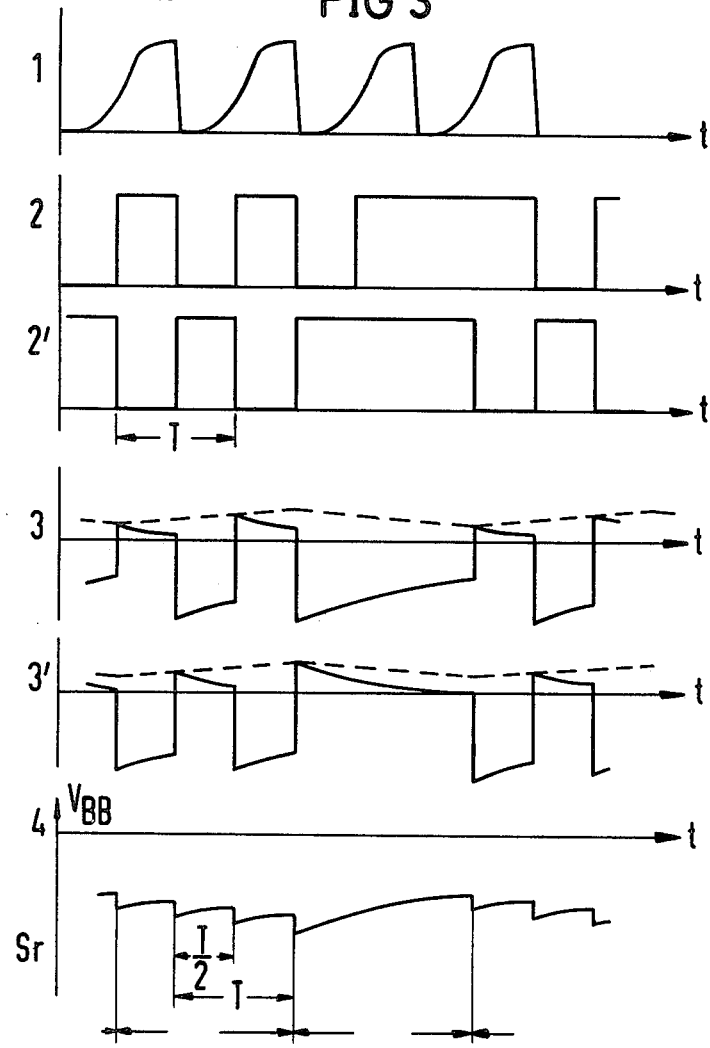

SEMICONDUCTOR CIRCUIT WITH AT LEAST TWO FIELD EFFECT TRANSISTORS UNITED IN A SEMICONDUCTOR CRYSTAL

BACKGROUND OF THE INVENTION

The invention relates to a semiconductor circuit with at least two field effect transistors united in a semiconductor crystal with insulated control electrodes and coincident conductivity type of their source and sink zones which are surrounded in common by a semiconductor area of the opposite conductivity type. A generator exhibiting an oscillator and a control loop with a threshold voltage detector is provided for generating an auxiliary voltage $V_{BB}$ to be applied between the semiconductor area of the opposite conductivity type and ground. This auxiliary voltage is applied to the parts of the semiconductor circuit to be loaded via a pump circuit provided at the output of the generator.

Such a semiconductor circuit is discussed in "Electronics," Sept. 16, 1976, page 42 and in "1976 IEEE International Solid-State Circuit Conference, " pages 56/57, both incorporated herein by reference. In these semiconductor circuits, the substrate bias generator is integrated, is likewise realized in MOS technology, and pumps electric charges into the area of the opposite conductivity type surrounding the current-bearing zones of the field effect transistors generally designated as a substrate. A very narrow range of fluctuation of access time and power consumption from chip to chip results from the regulation of the pump process, since the effects of fluctuations of the process parameters, temperature and supply voltage are reduced.

In the known arrangements, the pump circuit is formed by means of a capacitance with a MOS-diode connected to the substrate and via which electric charge is pumped into the substrate during the operation of the generator. The capacitance is driven by means of an oscillator with an amplifier. However, as a result of the substrate leakage current, the bias voltage $V_{BB}$ to ground conditioned by the charging of the substrate again decreases until the occurrence of the respectively next falling edge of the oscillator pulse.

SUMMARY OF THE INVENTION

The object of the invention is to modify the concept underlying the known substrate bias voltage generators in such manner that an acceleration of the control and, thus, a reduction of the decrease of the substrate bias voltage is guaranteed and, thus, a reduction of the fluctuations of the bias voltage $V_{BB}$ is provided.

To this end, it is proposed according to the invention that a bistable flip-flop with a direct signal input and an inverted signal input as well as two corresponding signal outputs and a third input controlling the turn-on threshold of the flip-flop is connected in such manner that its two signal inputs receive the output signal of the oscillator directly and inverted and the third input lies at the control loop. The two signal outputs are connected to the semiconductor area of the opposite conductivity type (i.e., the substrate) and to ground via a respective pump circuit.

Accordingly, it may be noted that usually, at least in a part of the field effect transistors united in the semiconductor crystal, a current-bearing electrode (usually the source electrode) is connected to ground.

Compared with the known arrangements with the substrate bias voltage generator, a semiconductor circuit according to the invention offers the decided advantage that two pump circuits and, thus the charge capacitances contained in them, generates the desired correction of the bias voltage of the semiconductor area of the opposite conductivity type—generally designated as substrate in the following—in a push-pull action and, thus, reduce the fluctuations of $V_{BB}$ in comparison to an installation which only uses a single pump circuit, to which end there is required neither an increase of the oscillator frequency nor a noticeable increase of the power consumption of the semiconductor circuit in comparison to the corresponding, integrated circuit with a substrate bias voltage generator of a known type.

BRIEF DESCRIPTION OF THE DRAWINGS

FIG. 1 shows a block diagram of a substrate bias voltage generator corresponding to the invention;

FIG. 3 presents by a plurality of time-voltage diagrams the temporal behavior of the electrical voltages at a few important points of the arrangement illustrated in FIGS. 1 and 2; and FIG. 4 is a top view of the semiconductor substrate surrounding two field effect transistors.

DESCRIPTION OF THE PREFERRED EMBODIMENTS

Figure 2:
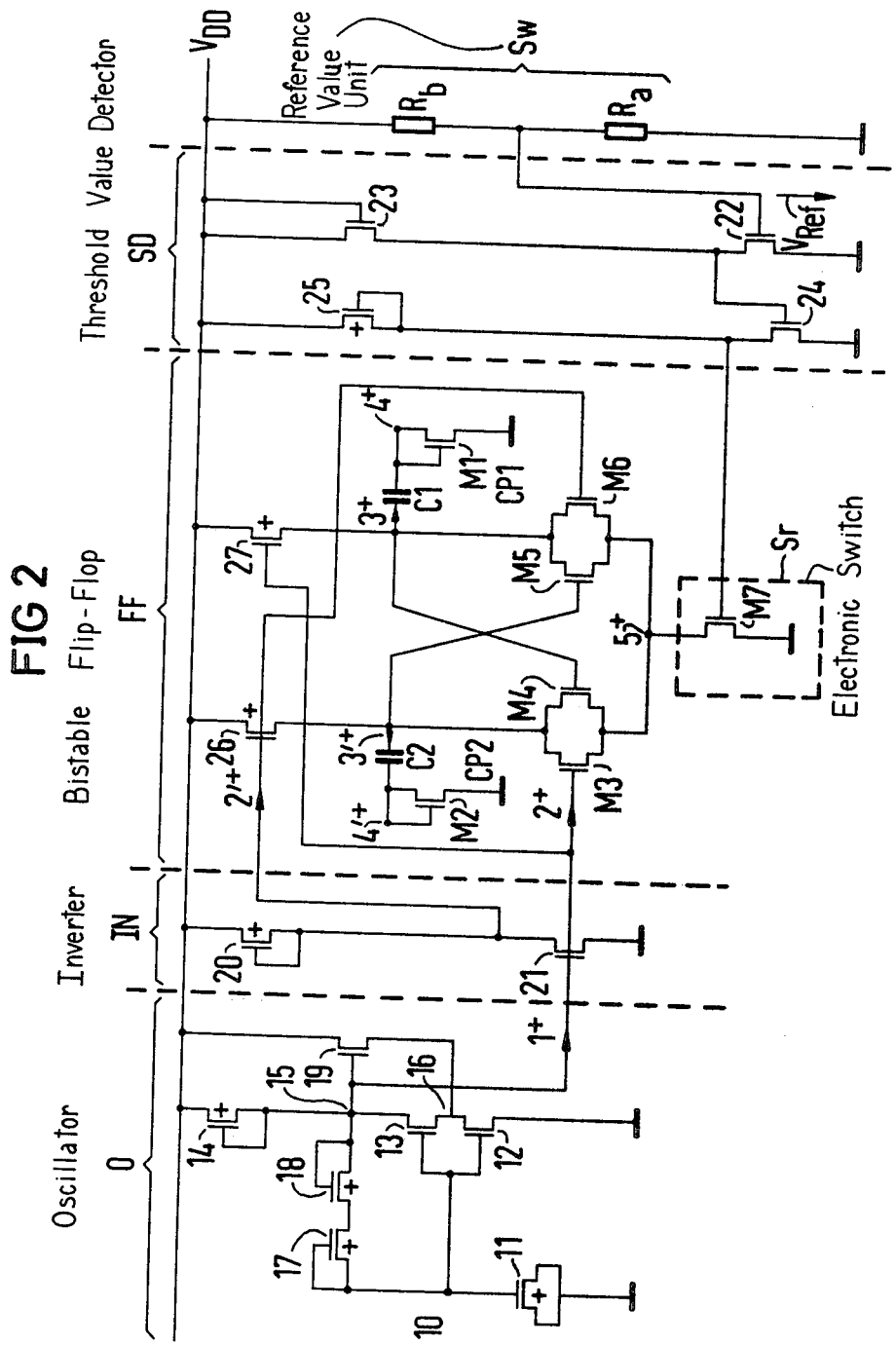
FIG. 2 is a more detailed embodiment in MOS-Technology which is therefore compatible with the actual semiconductor circuit and is integrable on a single silicon chip.

In the installation illustrated in FIG. 1, an oscillator 0, for example a RC-oscillator, generates periodic pulses which are applied directly or, respectively, inverted to the two signal inputs of a bistable flip-flop FF of the type defined above. They thus trigger corresponding flip processes on the basis of which rectangular signals appear at the two signal outputs of the bistable flip-flop FF. These rectangular signals then arrive at the substrate S or, respectively, to ground via to the two pumps circuits CP1 and CP2 and in this manner effect a loading of the substrate S.

The bistable flip-flop can, for example, be constructed in the manner of a RS flip-flop. It is important above all that a third input is present in addition to the two signal inputs R and S, namely a control input for the adjustment of the turn-on threshold of the flip-flop or, respectively, for the switching on and off of th e same. The output of the oscillator 0, the outputs of the bistable flip-flop FF, and the outputs of the two pump circuits CP1, CP2 are numbered in the manner that can be seen in FIG. 1 or, respectively, FIG. 2, which corresponds to the numbering of the diagrams in FIG. 3.

The threshold voltage detector SD forming the control loop along with a reference value unit SW is connected to the control input of the bistable flip-flop FF via an electronic switch Sr. The reference value is given by means of a reference voltage $V_{Ref}$. The threshold voltage detector SD implicity contains the comparator of the controlling stage.

The two pump circuits CP1 and CP2 are alike and consist of one respective capacitance C1 or , respectively C2 and one respective field effect transistor M1 or, respectively, M2 of the enhancement type which is connected as an electrical resistor. MOS-Varactor capacitances are provided as capacitors, which are formed by capacitance between a metal layer or a layer of doped polysilicon and the inversion layer on the surface of the semiconductor body with the $SiO_2$-layer located between as the dielectric. Preferably, the required capacitances are supplied by means of field transistors of the depletion type which exhibit a sufficiently large gate surface and whose source and sink electrodes are connected with one another.

The control electrode (gate) of the field effect transistor M1 or, respectively, of the field effect transistor M2 is directly conductively connected to a current-bearing electrode of the respective transistor, preferably the sink (drain). The circuit of the capacitance and the field effect transistor is selected in the individual pump circuit in such manner that the one terminal of the charging or pump capacitance C1 or, respectively, C2 lies at the respectively allocated signal output of the bistable flip-flop FF and its other terminal lies at the sink electrode of the respectively allocated MOS-Field transistor M1 or, respectively, M2. Moreover, the sink electrodes of the field effect transistors M1 or, respectively, M2 lie at the substrate of the integrated semiconductor circuit via a respective diode D1 or, respectively, D2; whereas the source electrodes (source) are connected to ground.

The substrate S, i.e., the semiconductor area surrounding the field effect transistors of the semiconductor circuit with a conductivity type which is opposite that of the source and sink zones of all of these field effect transistors, is illustrated in FIG. 1 by its equivalent circuit diagram. According to this, one has a substrate loading capacitance $C_s$ and a leakage resistance $R_s$ lying parallel to one of these. The time behavior shown in the last diagram of FIG. 3 shows the voltages with respect to ground occurring at the substrate S on the basis of the influence of the substrate bias voltage generator. The diodes D1 and D2 provided between the substrate S and the outputs 3 or, respectively, 3' of the two pump circuits CP1 and CP2 are implicitly provided by means of the pn-junctions defining the sink zones of the two transistors M1 and M2 when these transistors and, thus, the entire substrate bias voltage generator is surrounded by the substrate S, so that in practice they need not be specifically provided.

The voltage pulses derived from the pump capacitances C1 and C2 of the two pump circuits CP1 and CP2 at the two signal outputs 2 and 2' of the bistable flip-flop FF are conducted into the substrate S, whereby the transistors M1 and M2 cut off the positive signal pulses up to a voltage value of the threshold voltage $V_T$. As a result of the leakage current $J_L$ at the parasitic substrate resistor $R_s$, the bias voltage $V_{BB}$ between the substrate and ground drops somewhat until the next falling edge of the voltage pulse delivered with phase displacement to the two pump circuits CP1 and CP2, i.e., for half the duration of the oscillator pulse.

The switch $S_r$ functions as the positioning element of the control circuit. When it interrupts the effect of the control loop on the control input of the bistable flip-flop FF, then the control pauses occur that can be seen in the last diagram of FIG. 3.

The embodiment of the inventive substrate bias voltage generator illustrated in FIG. 2 is exclusively constructed with the help of field effect transistors of the MOS-type (or, more generally, of the MIS-type), which are partially of the enhancement type and partially of the depletion type. The transistors of the substrate bias voltage generator are either only n-channel transistor or only p-channel transistors. n-channel transistors are used when the transistors of the integrated circuit to be supplied are likewise n-channel transistors. The analogue is true when the IC to be supplied used only p-channel transistors. If the circuit to be supplied has both n-channel as well as p-channel transistors, as is particularly the case upon employment of C-MOS technology, then expediently, two substrate bias voltage generators—the one with n-channel transisitors, the other with p-channel transistors—are provided, which are respectively responsible for the supply of the corresponding transistor-type in the actual semiconductor circuit.

As can be seen from FIG. 2, the oscillator 0 is a Schmitt-trigger with RC-back coupling. A MOS-varactor capacitance 11, which lies at ground on the one hand and at input 10 of the Schmitt-trigger on the other hand, serves as the back-coupling capacitance.

The Schmitt-trigger consists of the three transistors 12, 13 and 14 connected in series between the supply voltage $V_{DD}$ and ground as well as the transistor 10 whose drain-source portion lies between $V_{DD}$ and the common diffusion area of the transistors 12 and 13. Transistor 14 is of the depletion-type and fills the function of a loading element. Its gate and source electrode are conductively connected to one another and, together with the gate electrode of transistor 19, the drain electrode of transistor 13, and the drain and gate electrode of transistor 18, from the juction 15 which represents the output of the oscillator 0.

The gate electrodes of transistors 12 and 13 are connected with one another and lie at the input 10 of the Schmitt-trigger. Further, the input 10 and the output 15 of the Schmitt-trigger are bridged by the series connection of the source-drain section of the depletion-type transistors 17 and 18. This series connected forms the back-coupling branch of the oscillator to which the already mentioned capacitance 11 also belongs. The transistors 17 and 18 are therefore connected as resistors, in that the gate and the drain connection of transistor 18 lies at junction 15, its source connection lies at the drain connection of transistor 17, and the gate drain of transistor 17 lie at the input 10 of the Schmitt-trigger. Whereas the transistors 14, 17 and 18 are of the depletion-type, enhancement-type transistors are used as transistors 12, 13 and 19.

In contrast to known Schmitt-trigger oscillators, the present embodiment exhibits two oppositely connected depletion-type transistors in the back-coupling branch. That provides the advantage that the oscillator signal exhibits a mark-space ratio of 1:1. As a result, a symmetric pump signal with pauses of equal length between the pump processes results, whereby the effectiveness of the substrate bias voltage generator is significantly improved.

The oscillator output 15 leads to the first signal input of the bistable flip-flop FF as well as to the signal input of an inverter IN lying between ground and the supply voltage $V_{DD}$. This inverter IN is formed by a field effect transistor 20 of the depletion-type connected as a resistor and a field effect transistor 21 of the enhancement-type connected to it in series. The output of the inverter IN is formed by a circuit point between the source drain sections of the two field effect transistors 20 and 21 and lies at the second input of the bistable switch cell FF.

A voltage divider lying between ground and the supply voltage $V_{DD}$ is used as the reference value unit SW for the control loop. The voltage divider has two fixed resistors $R_a$ and $R_b$ which can be realized, for example, by transit paths of doped polysilicon applied to the $SiO_2$-layer covering the semiconductor surface. The division point between the two resistors $R_a$ and $R_b$ of the reference value unit SW has a potential which, together with the potential at ground, produces the reference voltage $V_{ref}$.

It lies at the gate of a field effect transistor 22 which forms the input of the threshold voltage detector SD.

The threshold voltage detector SD is formed by a series connection of the source-drain sections of two field effect transistors 22 and 23 of the enhancement-type and by a series connection of the source-drain sections of a field effect transistor 24 of the enhancement-type and a field effect transistor 25 of the depletion-type. Accordingly, the last-mentioned field effect transistor 25 and the field effect transistor 23 of the first-mentioned series connection are respectively connected as a loading element in the manner to be seen in FIG. 2.

These series connections fulfill the function of inverter stages and bridge the potential difference between the supply potential $V_{DD}$ and ground. The output of the inverter with the two field effect transistors 22 and 23, i.e., a circuit point between these two transistors, is connected to the gate of the transistor 24. The output of the inverter with the two field effect transistors 24 and 25, i.e., a circuit point between these two transistors, is connected to the gate of a transistor M7 of the enhancement-type which represents the switch Sr.

The bistable flip-flop FF, to be described now, consists of two branches that are parallel to one another, which are loaded on the one hand by the potential $V_{DD}$ and, on the other hand, end in a junction 5 lying at the drain of the transistor M7. Each of these two branches contains three field effect transistors and a respective connection location for a pump circuit CP1 or, respectively, CP2. Further, these two branches also exhibit a cross-coupling which is essential for the creation of the flip-flop effect.

The transistor M7 has the task of connecting the source areas of the switching transistors, M3, M4 or, respectively M5, M6 to ground in order to thus activate the bistable flip-flop FF and initiate the delivery of the supply voltage for ths substrate S.

The first of the said branches contains the parallel connection of the source-drain sections of the two field effect transistors M3 and M4 which are both of the enhancement-type and whose source lies at the junction 5+ and whose drain lies at the source of a transistor 26 of the depletion-type. The drain of the transistor 26 lies at $V_{DD}$ and its gate lies at the output of the inverter IN. The connection location 3'+ for the pump circuit CP1 lies between the transistor 26 and the two transistors M3 and M4. The second of these branches contains the parallel connection of the source-drain sections of the two field effect transistors M5 and M6 which are again of the enhancement-type and whose source lies at junction 5+. The drain zones of these two transistors are connected with the source of a depletion-type transistor 27. The drain of the field effect transisitor 27 lies at $V_{DD}$ and its gate at output 15 of the oscillator 0. The connection location 3+ for the pump circuit CP1 lies between the transistor 27 and the two transistors M5, M6.

In order to achieve the flip-flop effect, the gates of the transistors M4 or, respectively, M5 in the two branches of the bistable flip-flop are respectively connected to a circuit point of the other branch which lies between the parallel connection of the two enhancement transistors and the depletion-type transistor of the other branch. At this same time, the circuit points form the outputs 3+ or, respectively, 3'+ of the bistable flip-flop FF at which the pump circuits CP1 and CP2 are connected.

When the threshold voltage $V_T$ falls below the rated value $V_{ref}$ as a result of the substrate leakage current $J_L$, then the transistor M7 is switched on and, by so doing, an activation of the transistor M3, M4, M5 and M6 is achieved. When, on the other hand, the threshold voltage $V_T$ rises above the reference voltage $V_{ref}$, then transistor M7 switches off and the voltage $V_{BB}$ lying between ground and the substrate again changes as a result of the substrate leakage current until switch M7 is again switched on.

By using the bistable flip-flop FF as the positioning element for the regulating process of the substrate bias voltage generator, a more rapid regulation is achieved than when the oscillator 0 itself is used as the positioning element. By contrast, in the known arrangements the substrate bias voltage generator is regulated via the oscillator, so that the regulation functions more slowly there. The present embodiment of a substate generator, moreover, allows its realization in MOS-IC technology and its inclusion with the actual integrated semiconductor circuit on a common silicon chip.

The pulse behavior of the arrangement illustrated in FIGS. 1 and 2 is reproduced in FIG. 3. This contains six pulse-time diagrams with time t as abscissa and the pulse voltage to ground as ordinate.

The behavior of the voltage arising at the output 15 of the oscillator 0 is illustrated in the first diagram. The second diagram and the third diagram reproduce the voltages arising at the outputs 2+ and 2'+ of the bistable flip-flop FF. The time T is the period of the pulses delivered from the oscillator 0. The fourth and fifth diagram show the states at the outputs of the two pump circuits CP1 and CP2, and the last diagram shows the course of the substrate bias voltage $V_{BB}$ upon consideration of the effect of the switch Sr. One can see how $V_{BB}$ decreases during the switched-off state of the substrate bias voltage generator and is again brought up to the full value after it is again switched on.

We claim as our invention:

1. A semiconductor circuit, comprising: at least first and second pump circuit means connected for biasing by an auxiliary voltage a semiconductor area relative to ground; a first field effect transistor (FET) in the first pump circuit means and a second FET in the second pump circuit means; an oscillator; a bistable flip-flop having a direct signal input and an inverted signal input both connected to receive an output signal from the oscillator; third input means of the bistable flip-flop for controlling a turn-on threshold thereof; a control loop including a threshold voltage detector connecting to the third input means of the bistable flip-flop; and first and second signal outputs of the flip-flop being respectively connected to the first and second pump circuit means.

2. The circuit of claim 1 wherein the control loop further includes a reference value means connecting to the threshold voltage detector and each of the pump circuit means connects to the semiconductor area through a diode.

3. A semiconductor circuit according to claim 1 wherein the first and second pump circuit means include first and second pump capacitances respectively connecting to the first and second field effect transistors of the enhancement-type, said first and second pump circuit means being substantially indentical to one another; one end of the first and second pump capacitances being applied to first and second signal outputs respectively of the bistable flip-flop, the other end of the first and second capacitances being applied to the sink of the respective first and second field effect transistors; a control electrode of each field effect transistor conductively being connected to the sink zone of the same transistor; the sink zone of each transistor being applied to the semiconductor area via a respective diode; and the source zone of each transistor being connected to ground.

4. A semiconductor circuit according to claim 1 wherein the oscillator is designed as a RC-oscillator.

5. A semiconductor circuit according to claim 1 wherein the oscillator is designed as a Schmitt-trigger with RC-back coupling.

6. A semiconductor circuit according to claim 5 wherein the oscillator includes; a series connection of third, fourth and fifth field effect transistors between a supply voltage and ground; the third and fourth field effect transistors lying closer to ground being connected in common by their control electrodes to a first terminal of a varactor capacitance formed by a varactor diode; a second terminal of the capacitance being connected to ground; a series connection of sixth and seventh field effect transistors being connected as resistor and positioned between the first terminal of the capacitance and a junction between the fifth field effect transistor and the fourth field effect transistor; an eighth field effect transistor having its gate connecting to the seventh FET and its channel between the supply voltage and the connection between the third and fourth FETs.

7. A semiconductor circuit according to claim 6 wherein the varactor capacitance is provided by a capacitance of a control electrode of a field effect transistor against its semiconductor body.

8. A semiconductor circuit according to claim 1 wherein the reference value unit comprises a voltage divider formed from two resistors in series between a supply voltage and ground; and a division point between the two resistors being applied to a control electrode of a field effect transistor forming an input of the threshold voltage detector.

9. A semiconductor circuit according to claim 1 wherein the threshold voltage detector comprises: a first series connection of two FETs and a second series connection of two FETs applied between ground and a supply voltage; in the first series connection, the transistor closer to ground is loaded by means of the reference voltage delivered from a reference voltage unit via its control electrode, and the transistor lying further from ground is connected as a resistor; in the second series connection, a control electrode of the transistor lying closer to ground is directly controlled by a circuit point between the two transistors of the first series connection; in the second series connection, the field effect transistor lying further from ground is connected as a resistor; and a circuit point lying between the transistor loaded by means of the first series connection and the transistor connected as a resistor is provided as an output of the threshold voltage detector for the actuation of an electronic switch.

10. A semiconductor circuit according to claim 1 wherein an output of the oscillator is applied to the bistable flip-flop direct signal inputs directly and to the inverted signal input via an inverter formed by means of a series connection of two field effect transistors.

11. A semiconductor circuit according to claim 10 wherein the inverter series connection of two field effect transistors lies between ground and a supply voltage; a control electrode of the transistor of the series connection closer to ground being controlled by the output of the oscillator; the transistor further from ground being connected as a resistor; and a circuit point lying between the two transistors forming an output of the inverter.

12. A semiconductor circuit according to claim 1 wherein an output of the threshold value detector connects to the third input means of the bistable flip-flop through a field effect transistor serving as an electronic switch.

13. A semiconductor circuit according to claim 12 wherein a sink electrode of the field effect transistor serving as the electronic switch is applied to the third input means of the bistable flip-flop; and two identical, cross-coupled branches respectively formed by a combination of field effect transistors lead from this third input means to a supply voltage.

14. A semiconductor circuit according to claim 1 wherein the bistable flip-flop comprises first and second branches. jointed together at the third input means; the first branch comprising a parallel connection of ninth and tenth FETs which are in turn series connected to a thirteenth FET connecting to the supply voltage; the second branch comprises parallel connected eleventh and twelfth FETs which are series connected to a fourteenth FET connecting to the supply voltage; the first pump circuit means connecting to a junction between the twelfth and fourteenth FETs and the second pump circuit means connecting to a junction between the ninth and thirteenth FETs.

15. A semiconductor circuit according to claim 1 wherein one of the source and sink zones of the first and second FETs provided within the semiconductor area is applied to ground.

16. A semiconductor area bias voltage generator for biasing a semiconductor area comprising:
 (a) first and second pump circuit means for biasing a semiconductor area and each having an output connected to the semiconductor area;
 (b) each pump circuit means having a pumping capacitance connecting to a field effect transistor;
 (c) a bistable flip-flop having first and second outputs respectively connecting to inputs of the first and second pump circuit means;
 (d) an oscillator connected to first and second inputs of the bistable flip-flop; and
 (e) threshold voltage detector control means connecting to a turn-on threshold control input of the bistable flip-flop.

* * * * *